United States Patent
Rzehak

(10) Patent No.: US 7,760,118 B2
(45) Date of Patent: Jul. 20, 2010

(54) MULTIPLEXING AWARE SIGMA-DELTA ANALAG-TO-DIGITAL CONVERTER

(75) Inventor: Volker Rzehak, Ergolding (DE)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 12/174,729

(22) Filed: Jul. 17, 2008

(65) Prior Publication Data

US 2009/0051577 A1    Feb. 26, 2009

(51) Int. Cl.
*H03M 3/00*    (2006.01)
(52) U.S. Cl. .................. 341/143; 341/141; 341/155
(58) Field of Classification Search .............. 341/141, 341/143, 155
See application file for complete search history.

(56) References Cited

U.S. PATENT DOCUMENTS 5,345,236 A * 9/1994 Sramek, Jr. ............... 341/144
5,627,536 A * 5/1997 Ramirez .................... 341/141
6,041,080 A * 3/2000 Fraisse ...................... 375/242
6,208,279 B1 * 3/2001 Oprescu .................... 341/143
6,642,879 B2 * 11/2003 Amar et al. ................ 341/155

FOREIGN PATENT DOCUMENTS

DE    103 02 635 A1    7/2004

* cited by examiner

*Primary Examiner*—Jean B Jeanglaude
(74) *Attorney, Agent, or Firm*—Robert D. Marshall, Jr.; W. James Brady; Frederick J. Telecky, Jr.

(57) ABSTRACT

The present invention relates to an electronic device for analog-to-digital conversion including a sigma-delta modulator (SD), a digital filter (FIL) for digital post processing of the output signal of the sigma-delta modulator (SD), a multiplexer (MUX) for switching the input (INSD) of the sigma-delta modulator between a first input signal (IN1) and a second input signal (IN2), a memory (MEM) adapted to hold the register content of the digital filter relating to the first input signal while the second input signal (IN2) is processed in the digital filter, and a controller (CNTL) to retrieve the register contents from the memory (MEM) when processing of the first input signal (IN1) in the digital filter is resumed.

7 Claims, 1 Drawing Sheet

US 7,760,118 B2

MULTIPLEXING AWARE SIGMA-DELTA ANALAG-TO-DIGITAL CONVERTER

CLAIM OF PRIORITY

This application claims priority under 35 U.S.C. 119(a) to German Patent Application No. 10 2007 033 390.2-31 filed Jul. 19, 2007.

TECHNICAL FIELD OF THE INVENTION

The technical field of this invention is an electronic device for analog-to-digital conversion, more specifically to a sigma-delta modulator with a digital filter.

BACKGROUND OF THE INVENTION

There are numerous different principles and basic architectures to perform analog-to-digital conversion. For example, there are successive approximation converters (SAR), flash converters, pipeline converters and sigma-delta converters (SD-converters). Almost all kinds of converters compare the analog input signal to one or more reference values. SD-converters use a rather raw comparison in combination with noise shaping and oversampling. SD-converters are generally robust against production spread and component mismatch and are typically used to achieve very high resolutions. SD-converters include an SD-modulator stage, which operates at a very high clock rate (oversampling rate), much higher than the signal bandwidth of the input signal. Digital post processing by digital filters produces the desired multi-bit digital output word at a lower clock rate. The digital filters used for post-processing of an SD-modulator output signal have a specific transfer function (e.g. low pass characteristic) to remove unwanted spectral parts from the digital output signal, which would otherwise fold into the signal band, while down-sampling the digital signal. Once the (e.g. high frequency) noise is suppressed in the digital output signal, the sampling rate can be reduced and the bit width of the digital output words is increased. As chip area is an important economic factor regarding production of integrated circuits, reuse of a single analog-to-digital converter in multi-channel applications is often considered. This could be implemented by multiplexing a single analog-to-digital converter between multiple channels.

Multiplexing multiple different input signals to a single analog-to-digital converter is possible only if the time a converter needs to settle to a new input signal and to produce a corresponding digital output value is acceptable. Compared with other architectures, like SAR, pipeline, or flash converters, the digital output filters for post processing of the digital output signals of the modulator in SD-converters often need too much time to settle. This is due to the usually large time constants of those filters, which are necessary to provide sufficient noise suppression. Therefore switching the input of an SD-converter between two analog input signals takes a lot of time for the settling process before the output signal is valid again due mainly to the large time constants of the digital filters. This could be avoided by further increasing the sampling frequency of the SD-modulator and the digital filter, but this highly uneconomical in terms of power consumption. Therefore, conventional multi-channel applications using SD-converters provide one complete sigma-delta modulator and a corresponding digital filter for each channel.

SUMMARY OF THE INVENTION

It is an object of the present invention to provide an electronic device with a sigma-delta analog-to-digital converter which can be switched between multiple input signals with only little delay.

According to an aspect of the present invention, an electronic device for analog-to-digital conversion includes a sigma-delta modulator, a first digital filter for digital post processing of the output signal of the sigma-delta modulator and a second digital filter for digital post processing of the output signal of the sigma-delta modulator. A multiplexer switches the input of the sigma-delta modulator between a first input signal and a second input signal. A controller activates either the first or the second digital filter for post-processing of the sigma-delta modulator output signal if the input signal of the sigma-delta modulator is switched between the first input signal and the second input signal. Accordingly, the sigma-delta converter is aware of the switched input signal because the output of the modulator is also switched from one digital filter to another. It is not necessary to provide two complete sigma delta converters, but only one modulator and two digital filters. After the sigma-delta modulator was switched from one input signal to another, some samples of the sigma-delta modulator are preferably discarded. This aspect of the invention takes account of the settling time of the modulator. As the modulator has a much higher clock rate than the digital filter and a much shorter settling time, only a small number of samples (i.e. clock cycles) are needed before the modulator has settled. Thereafter, it is possible to feed the output samples of the sigma-delta modulator to the respective digital filter, e.g. to the first digital filter for the first input signal and to the second digital filter for the second input signal.

The present invention also provides an electronic device for analog-to-digital conversion including a sigma-delta modulator, a digital filter for digital post processing of the output signal of the sigma-delta modulator and a multiplexer switching the input of the sigma-delta modulator between a first input signal and a second input signal. Further, there is a memory storing any register content and coefficient values of the digital filter relating to the first input signal while the second input signal is processed in a digital filter. A controller retrieves the register contents from the memory when processing of the first input signal in the digital filter resumes. Accordingly, it is possible to switch between two input signals with a reduced settling time of the digital filter. The register contents of the digital filter represent the internal state relating to a specific input signal. Storing the internal state of the first input signal when processing is switched to a second input signal allows the register contents to be used as an initial condition for processing of the first input signal when analog-to-digital conversion of the first input signal resumes. Further, if the coefficients or other filter parameters are also stored, the filter characteristic (such as the transfer function) can be adapted when another input signal is processed.

According to an aspect of the present invention, the digital filter is only activated after a specific period of time corresponding to the settling time for the sigma-delta modulator. Because the sigma-delta modulator is used for processing several different input signals, the internal components of the sigma-delta modulator also adapts to the new conditions. This takes a specific time, which is much less than the delay of the digital filters. The sampling rate of the modulator is typically several factors higher than the signal bandwidth of the input signal, which is known as the oversampling ratio of the modulator. Accordingly, the settling process of the modulator, even if it takes several clock periods, is very short compared to the settling time of the digital filter. Advantageously, a rather small predetermined number of samples of the sigma-delta modulator are discarded after the switching, for example three to ten samples.

According to another aspect of the present invention, the sigma-delta modulator receives a reset pulse when the input signal is switched. Resetting the modulators, which can consist of discharging the internal capacitors of a switched capacitor architecture of the sigma-delta modulator, can further decrease the delay. Further, the reset pulse brings the modulators in a well-defined initial state, which can also speed up the settling procedure.

The sigma-delta modulator can be of first, second or higher order. However, using a modulator of low order is preferable to keep the delays small. The digital filter can be a decimation filter, such as a comb filter or a sinc filter.

According to an aspect of the present invention, a method is provided for analog-to-digital conversion including the following steps. An analog input signal is processed (i.e. modulated or converted) with a sigma-delta modulator. The input of the sigma-delta modulator is switched from a first input signal to a second input signal. Processing of a first digital filter function of the output signal of the sigma-delta modulator ceases when the input of the sigma-delta modulator is switched and the output signal is processed with a second digital filter function for a predetermined period of time. The predetermined period of time may include a specific number of samples. The first and second filter functions can be provided by two different digital filters, but they can also be provided by a single digital filter. Preferably, if a single filter (such as a hardwired filter stage or the like) is used the coefficients or the internal register contents of the filter are replaced upon switching of the input signal. The internal register values or the coefficients of each filter function can be stored in a memory. Accordingly, the sigma-delta converter becomes aware of the switching of the input signal and the whole conversion procedure can be performed with less complexity than prior art solutions.

Generally, according to the present invention, the number of input signals between the modulator is to be switched is unlimited as long as the necessary resources are provided, such as a memory for storing filter register contents or the number of parallel digital filters is provided.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
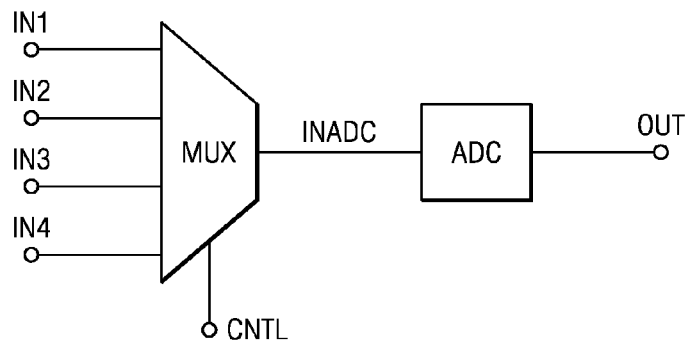
FIG. 1 shows a simplified diagram of an analog-to-digital conversion system with multiplexed inputs (prior art)

FIG. 1 shows a simplified block diagram of an arrangement for analog-to-digital conversion of multiple input signals IN1, IN2, IN3 and IN4. The input signals IN1 to IN4 pass through a multiplexer MUX which is controlled by a control signal CNTL. Accordingly, one of the input signals IN1 to IN4 is selected and passes to the input INADC of the analog-to-digital converter ADC. The analog-to-digital converter converts the analog input signal INADC and provides a digital output signal OUT. Dependent on the specific implementation of the analog-to-digital converter ADC, a delay occurs after switching from one input signal to the next. This is due to all kinds of internal settling procedures dependent on the specific architecture of the analog-to-digital converter.

Figure 2:
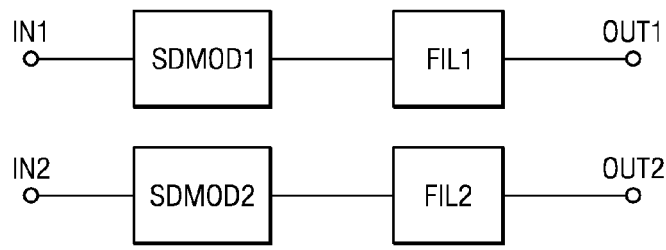
FIG. 2 shows two channels for analog-to-digital conversion of two input signals according to the prior art.

FIG. 2 shows a simplified block diagram of a conventional implementation using sigma-delta converters to convert multiple input signals IN1 and IN2. The first input signal IN1 is passed to a sigma-delta modulator SDMOD1. A first digital output filter FIL1 receives the output of the sigma-delta modulator SDMOD1. Digital filter FIL1 removes the high-frequency contents of the digital output signal of the sigma-delta modulator and typically decreases the sampling rate. Digital filter FIL1 may also perform other functions, if necessary. The output signal OUT1 is the digital representation of the analog input signal IN1. The same situation occurs for the second channel including sigma-delta modulator SDMOD2 and digital filter FIL2. The input analog signal IN2 is converted into the digital output signal OUT2. Due to the long time constants needed to switch between different input signals, two complete channels are provided.

Figure 3:
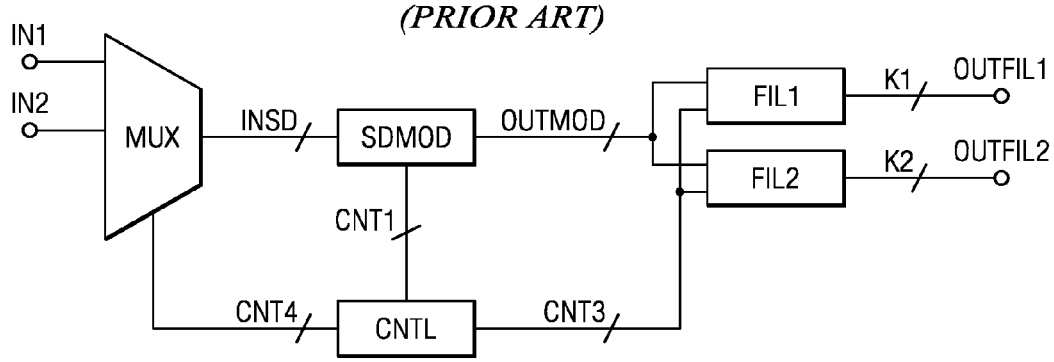
FIG. 3 shows a simplified block diagram of a first preferred embodiment of the present invention.

FIG. 3 shows a simplified block diagram of a first preferred embodiment of the present invention. Input signals IN1 and IN2 pass through a multiplexer MUX. Multiplexer MUX selects one out of the two input signals IN1 or IN2. The selected signal is supplied to sigma-delta modulator SDMOD as an analog input signal INSD. Multiplexer MUX is controlled by a control signal CNT4 provided by the controller CNTL. Sigma-delta modulator SDMOD produces a highly oversampled digital output signal OUTMOD which may be single-bit or multi-bit with a bit width of n. The output signal OUTMOD of the sigma-delta modulator SDMOD is filtered in one of two digital filters FIL1 or FIL2. The filters FIL1 and FIL2 serve to remove unwanted spectral parts from the signal OUTMOD. The digital filters FIL1 and FIL2 are controlled by the controller CNTL via control signal CNT3. If the input signal INSD is switched from one of the input signals IN1 or IN2 to another, the filters FIL1 and FIL2 are also switched. Thus the output OUTMOD is processed by a respective filter FIL1 or FIL2 corresponding to the input IN1 or IN2. The input signals IN1 and IN2 can be systematically and periodically switched as well as the filters FIL1 and FIL2. If the input of the sigma-delta modulator SDMOD is switched from one to another input signal, the sigma-delta modulator SDMOD needs a certain time to settle to the new input signal. Therefore, a certain number of samples of the SDMOD and the corresponding output values OUTMOD are discarded. A small number of samples such as about 3 to 5 samples may be sufficient. The sigma-delta modulator SDMOD can also be reset when the input INSD is switched between two input signals. Also, the respective digital filter FIL1 or FIL2 may only be activated after a settling time for the sigma-delta modulator. Specific settling times depend on the architecture and order as well as on the oversampling rate and the input signals of the whole system. The output signals OUTFIL1 and OUTFIL2 have bitwidths of k1 and k2 respectively and they are the digital representation of the respective analog input signals.

Figure 4:
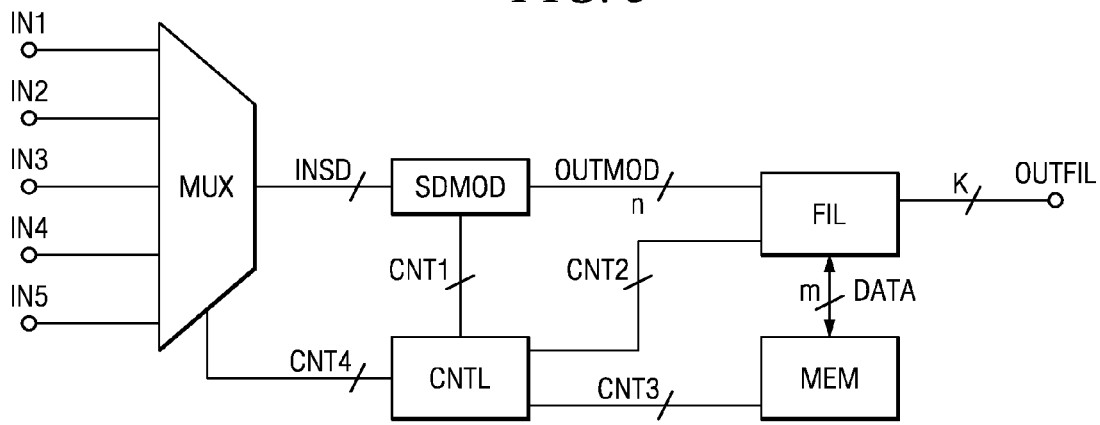
FIG. 4 shows a simplified block diagram of a second preferred embodiment of the present invention.

FIG. 4 shows a simplified block diagram of a second preferred embodiment according to the present invention. Accordingly, the input signals IN1 to IN5 pass through multiplexer MUX. Multiplexer MUX selects one out of the five input signals IN1 to IN5 as the analog input signal INSD to be converted by the sigma-delta modulator SDMOD. Multiplexer MUX is controlled by a control signal CNT4 provided by controller CNTL. Sigma-delta modulator SDMOD produces a highly oversampled digital output signal OUTMOD which can be single-bit or multi-bit with a bit width of n. Output signal OUTMOD of the sigma-delta modulator SDMOD is filtered in the digital filter FIL to remove unwanted spectral parts of the signal OUTMOD. Digital filter FIL is controlled by controller CNTL via control signal CNT2. Further, there is a memory MEM receiving internal data from filter FIL. The internal data to be stored may include any internal state of the filter, filter coefficients and other parameters to configure digital filter FIL. Controller CNTL uses control signals CNT2 and CNT3 to save the internal register contents including all relevant filter data of digital filter FIL to memory MEM if the input signal INSD is switched from one of the input signals IN1 to IN5 to another. If later during the conversion procedure, an input signal having corresponding data stored in memory MEM is used again, the register contents is retrieved from memory MEM to the digital filter FIL. As shown in FIG. 4, the present invention is not only useful to switch between two input signals, but can preferably be used to systematically and periodically switch between several input signals IN1 to IN5. The register contents of digital filter FIL relating to those input signals which are not presently processed is stored in memory MEM and retrieved if processing of the specific input signal is resumed. Sigma-delta modulator SDMOD is always reset when the input INSD is switched between two input signals. Digital filter FIL is only activated after a settling time for the sigma-delta modulator. Specific settling times depend on the architecture and order as well as on the oversampling rate and the input signals of the whole system. Output signal OUTFIL of a bitwidth of k is the digital representation of the sampled analog input signals.

What is claimed is:

1. An electronic device for analog-to-digital conversion comprising:
   a sigma-delta modulator (SDMOD);
   a digital filter (FIL) for digital post processing of the output signal of the sigma-delta modulator (SDMOD), said digital filter including registers storing content representing the internal state relating to a specific input signal;
   a multiplexer (MUX) for switching the input (INSD) of the sigma-delta modulator (SDMOD) between a first input signal (IN1) and a second input signal (IN2);
   a memory (MEM) adapted to hold the register content of said digital filter (FIL) relating to said first input signal while said second input signal (IN2) is processed in said digital filter and to hold the register content of said digital filter (FIL) relating to said second input signal while said first input signal (IN2) is processed in said digital filter; and
   a controller (CNTL) operable to retrieve the register contents relating to said first input signal from said memory (MEM) when said digital filter (FIL) resumes processing of said first input signal (IN1) and to retrieve the register contents relating to the second input signal from said memory (MEM) when said digital filter (FIL) resumes processing of said second input signal (IN2).

2. The electronic device according to claim 1, wherein:
   said digital filter (FIL) is only activated after a settling time for the sigma-delta modulator (SDMOD).

3. A method for analog-to-digital conversion comprising the steps of:
   selecting as an analog input (INSD) either a first analog input signal (IN1) or second analog input signal (IN2);
   processing said selected analog input signal (INSD) with a sigma-delta modulator (SDMOD);
   processing an output signal (OUTMOD) of the sigma-delta modulator (SDMOD) with a first digital filter function upon selection of said first analog input signal; and
   processing an output signal (OUTMOD) of the sigma-delta modulator (SDMOD) with a second digital filter function upon selection of said second analog input signal.

4. The method according to claim 3, wherein:
   said step of processing an output signal (OUTMOD) of the sigma-delta modulator (SDMOD) with a first digital filter function employs a first digital filter (FIL1); and
   said step of processing an output signal (OUTMOD) of the sigma-delta modulator (SDMOD) with a second digital filter function employs a second digital filter (FIL1).

5. The method according to claim 4, wherein:
   said step of processing an output signal (OUTMOD) of the sigma-delta modulator (SDMOD) with a first digital filter function employs a digital filter (FIL) loaded with a first set of coefficients and/or internal register contents; and
   said step of processing an output signal (OUTMOD) of the sigma-delta modulator (SDMOD) with a second digital filter function employs said digital filter (FIL) loaded with a second set of coefficients and/or internal register contents.

6. An electronic device for analog-to-digital conversion comprising:
   a sigma-delta modulator (SDMOD);
   a first digital filter (FIL1) for digital post processing of an output signal (OUTMOD) of said sigma-delta modulator (SDMOD);
   a second digital filter (FIL2) for digital post processing of said output signal (OUTMOD) of said sigma-delta modulator (SDMOD);
   a multiplexer (MUX) for switching and input (INSD) of said sigma-delta modulator (SDMOD) between a first input signal (IN1) and a second input signal (IN2); and
   a controller (CNTL) connecter to said first digital filter (FIL1), said second digital filter (FIL2) and said multiplexer (MUX) operative to alternately cause
   said multiplexer (MUX) to select said first input signal (IN1) and activate said first digital filter (FIL1), and
   said multiplexer (MUX) to select said second input signal (IN2) and activate said second digital filter (FIL2).

7. The electronic device according to claim 6, wherein:
   said controller (CNTL) is further operative to activate a corresponding one of either said first digital filter (FIL1) or said second digital filter (FIL2) only after a predetermined settling time for said sigma-delta modulator (SDMOD).

* * * * *